United States Patent
Chang et al.

(10) Patent No.: US 11,691,187 B2
(45) Date of Patent: *Jul. 4, 2023

(54) METHOD FOR CLEANING SUBSTRATE

(71) Applicant: TAIWAN SEMICONDUCTOR MANUFACTURING COMPANY LTD., Hsinchu (TW)

(72) Inventors: Hao-Ming Chang, Pingtung (TW); Chia-Shih Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/815,243

(22) Filed: Jul. 27, 2022

(65) Prior Publication Data

US 2022/0362814 A1   Nov. 17, 2022

Related U.S. Application Data

(63) Continuation of application No. 16/828,743, filed on Mar. 24, 2020, now Pat. No. 11,440,060.

(Continued)

(51) Int. Cl.
*H01L 21/02* (2006.01)
*B08B 3/08* (2006.01)
(Continued)

(52) U.S. Cl.
CPC .............. *B08B 3/08* (2013.01); *B08B 3/12* (2013.01); *G03F 1/82* (2013.01); *H01L 21/02068* (2013.01); *B08B 2203/005* (2013.01)

(58) Field of Classification Search
CPC combination set(s) only.
See application file for complete search history.

(56) References Cited

U.S. PATENT DOCUMENTS

| 9,739,913 | B2 | 8/2017 | Beasley et al. |
| 2017/0031241 | A1 | 2/2017 | Shen et al. |
| 2018/0151398 | A1* | 5/2018 | Wang .................... B08B 3/12 |

FOREIGN PATENT DOCUMENTS

| KR | 20170031199 A | 3/2017 |
| KR | 20180120866 A | 11/2018 |

OTHER PUBLICATIONS

US9739913B2 Corresponds to KR20170031199A.
English Abstract Translation of KR20180120866A.

* cited by examiner

*Primary Examiner* — Erin F Bergner
(74) *Attorney, Agent, or Firm* — WPAT Law; Anthony King

(57) ABSTRACT

A method for cleaning a substrate is provided. The method includes following operations. A substrate is received. The substrate has a plurality of conductive nanoparticles disposed over a surface of the substrate. A first mixture is applied to remove the conductive nanoparticles. The first mixture includes an SC1 solution, DI water and $O_3$. A second mixture is applied to the photomask substrate. The second mixture includes DI wafer and $H_2$. A temperature of the second mixture is between approximately 20° C. and 40° C. The applying of the second mixture further includes a mega sonic agitation, and a frequency of the mega sonic agitation is greater than 3 MHz. A flow rate of the first mixture is between approximately 1000 ml/min and approximately 5000 ml/min. A flow rate of the second mixture is between 1000 ml/min and approximately 3000 ml/min.

20 Claims, 13 Drawing Sheets

Related U.S. Application Data

(60) Provisional application No. 62/907,510, filed on Sep. 27, 2019.

(51) Int. Cl.
*B08B 3/12* (2006.01)
*G03F 1/82* (2012.01)

METHOD FOR CLEANING SUBSTRATE

PRIORITY DATA

This patent application is a continuation of U.S. patent application Ser. No. 16/828,743, filed on Mar. 24, 2020, entitled of "METHOD FOR CLEANING SUBSTRATE", which claims the benefit of U.S. Provisional Patent Application Ser. No. 62/907,510 filed Sep. 27, 2019, the entire disclosure of which is hereby incorporated by reference.

BACKGROUND

The semiconductor integrated circuit industry has experienced rapid growth in the past several decades. Technological advances in semiconductor materials and design have produced continuously smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Semiconductor fabrication relies heavily on the process of photolithography, in which light of a given frequency is used to transfer a desired pattern onto a wafer undergoing semiconductor processing. To transfer the pattern onto the wafer, a photomask (also referred to as a mask or reticle) is often used. The photomask permits light in a desired pattern onto a layer on the wafer, such as a photoresist (PR) layer, which chemically reacts to the light exposure, removing some portions of the PR layer and leaving other portions. The remaining PR is then used to pattern an underlying layer. As feature sizes have decreased, the wavelength of light used in photolithography to pattern layers has decreased as well, creating additional difficulties and necessitating technological advances, such as the use of extreme ultraviolet (EUV) as a light source, and phase-shifting masks. Improving photomasks is important to facilitating continuing advances in the industry, in particular because imperfections in the patterned layer can be compounded during subsequent processing steps in the manufacture of semiconductor devices and integrated circuits. Photomask improvements, including improvements to contamination or particle removal, are therefore required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
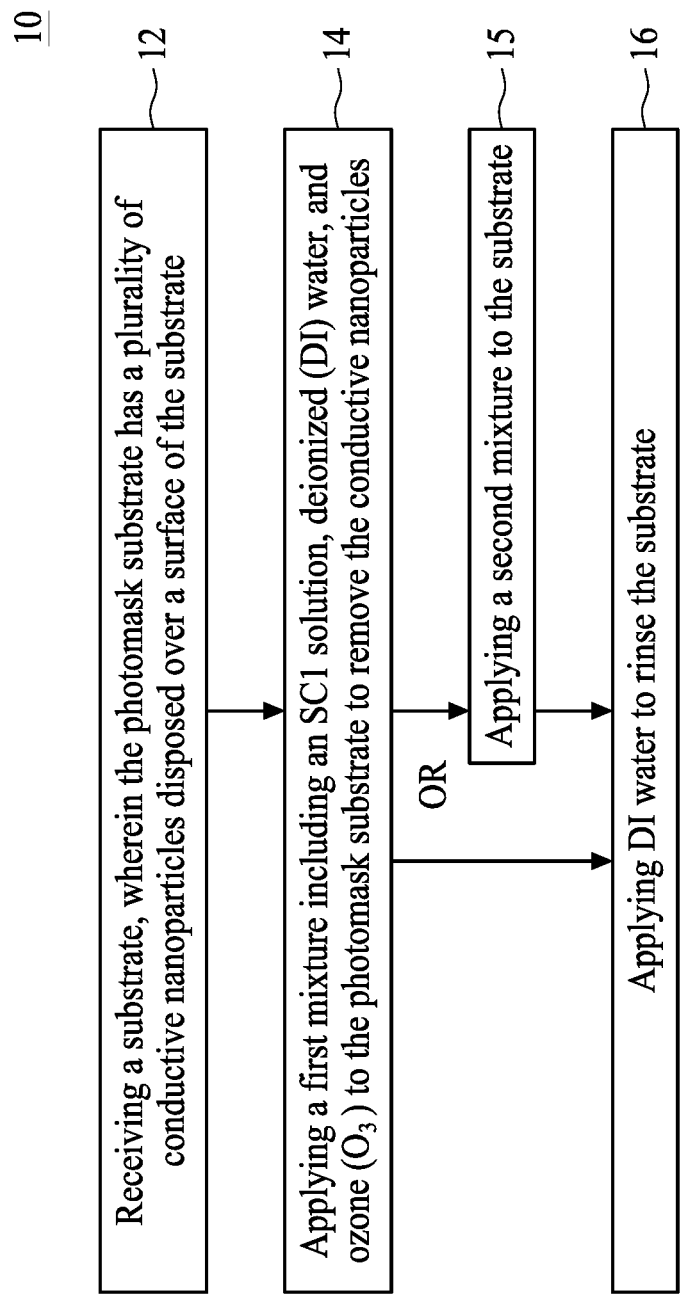
FIG. 1 is a flowchart representing a method for cleaning a photomask according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat references numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any references to direction or orientation is merely intended for convenience of description and is not intended in any way to limit the scope of the present disclosure. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected" refer to a relationship wherein structures are secured or attached to one another either directly or indirectly through intervening structures, as well as both movable or rigid attachments or relationships, unless expressly described otherwise. Moreover, the features and benefits of the disclosure are illustrated by references to the embodiments. Accordingly, the disclosure expressly should not be limited to such embodiments illustrating some possible non-limiting combination of features that may exist alone or in other combinations of features, the scope of the disclosure being defined by the claims appended hereto.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The term "nanoparticles" refers to atomic, molecular or macromolecular particles typically in the scale of approximately 1 to 100 nanometers in size. Typically, the novel and differentiating properties and functions of nanoparticles are observed or developed at a critical length scale of matter typically under 100 nm.

EUV photomasks and phase-shifting photomasks are used in the advanced semiconductor design of smaller and more complex circuits. The manufacturing of the EUV photomask is challenging because it needs to satisfy the requirement of the lithography condition. Typically, the material remaining on a shipped mask from a mask house includes an absorbing layer, a capping layer, a multilayer stack and a low thermal expansion material (LTEM, or substrate). The absorbing layer serves as a shielding layer, because the concept of the EUV mask is based on reflected light. The reflective multilayer stack has thicknesses optimized to provide the maximum constructive interference (Bragg reflection) to achieve about 60 to 75% reflectivity at the peak radiation wavelength (13.5 nm for EUV). The capping layer is located between the absorbing layer and the multilayer. The capping layer functions to maintain the optical reflectivity because the multilayer stack may be oxidized during illumination inside an EUV chamber. In some comparative approaches, a thickness of the capping layer may be adjusted to be less than approximately 5 nm, such that EUV light will not be absorbed by the capping layer, while the capping layer is still required to provide thermal and chemical stability. Accordingly, while a thin capping layer is necessary for EUV lithography, such thin capping layer must maintain a high level of integrity.

An effective cleaning operation is another important factor in photolithography. To achieve long-term stability in manufacturing operations, the optical photomasks and EUV photomasks require frequent cleaning to remove contamination, either before or after the optical lithography operation. For example, during an exposure operation, active etchants, radicals or chemical gases are distributed inside the chamber, and thus when an improper chemical reaction is induced, unwanted nanoparticles are formed. Such contamination and unwanted nanoparticles must be completely removed to maintain quality of the optical photomasks and the EUV photomasks. In comparative approaches, nanoparticles are attracted to the capping layer due to the high catalyst property and conductivity of the capping layer. Such nanoparticles are not easily removed by the current cleaning operations. Further, it is also required that the thin capping layer be able to resist damage by the cleaning operations.

The present disclosure therefore provides a method for removing contamination or nanoparticles from a substrate. In some embodiments, the method includes performing a cleaning operation for removing nanoparticles from a photomask substrate or a semiconductor substrate. In some embodiments, the method includes a cleaning operation for removing conductive nanoparticles from the photomask substrate or the semiconductor substrate. A removal rate of the conductive nanoparticles by the cleaning operation can be improved to greater than approximately 90% while maintaining a thin layer over the photomask substrate or the semiconductor substrate.

FIG. 1 is a flowchart representing a method for cleaning a substrate 10 according to aspects of the present disclosure. The method 10 includes a number of operations (12, 14, 15 and 16). The method for cleaning the substrate 10 will be further described according to one or more embodiments. It should be noted that the operations of the method for cleaning the substrate 10 may be rearranged or otherwise modified within the scope of the various aspects. It should further be noted that additional processes may be provided before, during, and after the method 10, and that some other processes may be only briefly described herein. Thus, other implementations are possible within the scope of the various aspects described herein.

FIGS. 2A to 2D are schematic drawings of a photomask at various stages according to aspects of the present disclosure in one or more embodiments, and FIGS. 3A to 3D are schematic drawings of another photomask at various stages according to aspects of the present disclosure in one or more embodiments. At operation 12, a photomask substrate is received.

Figure 2A:
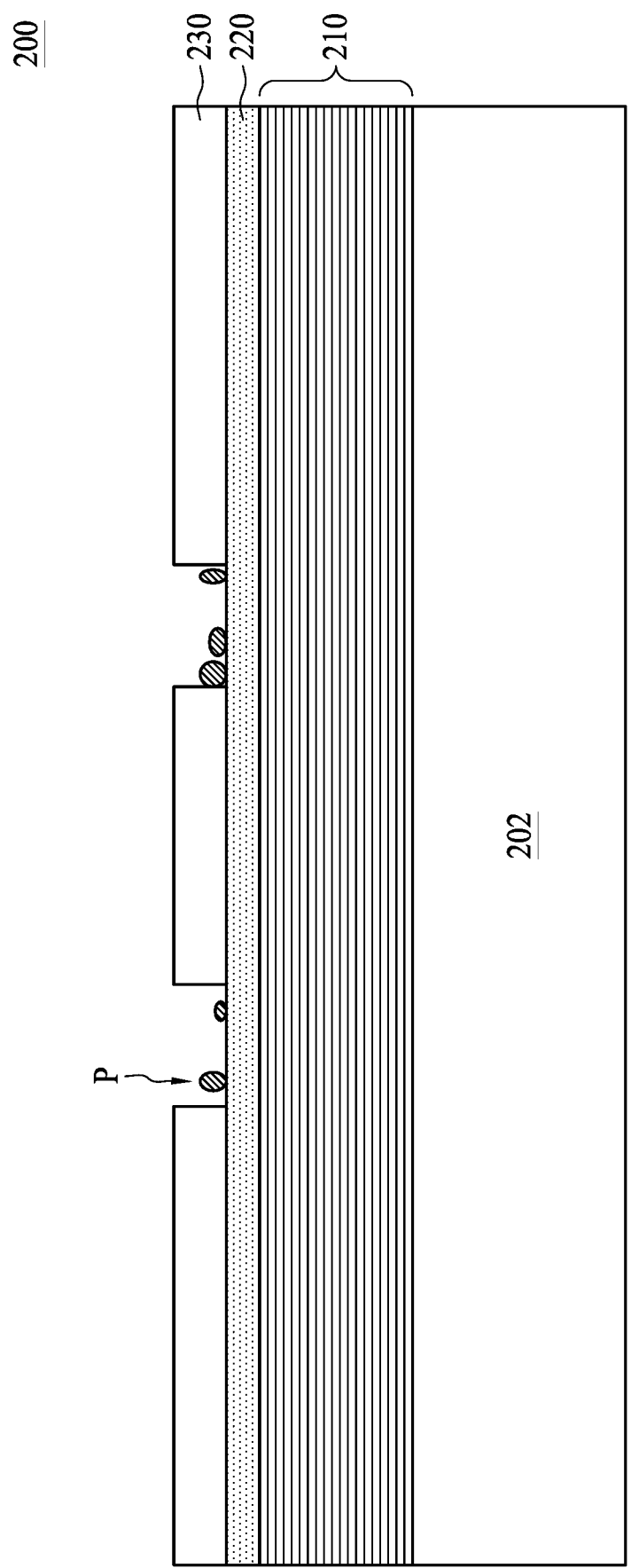
FIGS. 2A to 2D are schematic drawings of the photomask at various stages of fabrication according to aspects of the present disclosure in one or more embodiments.
Figure 3A:
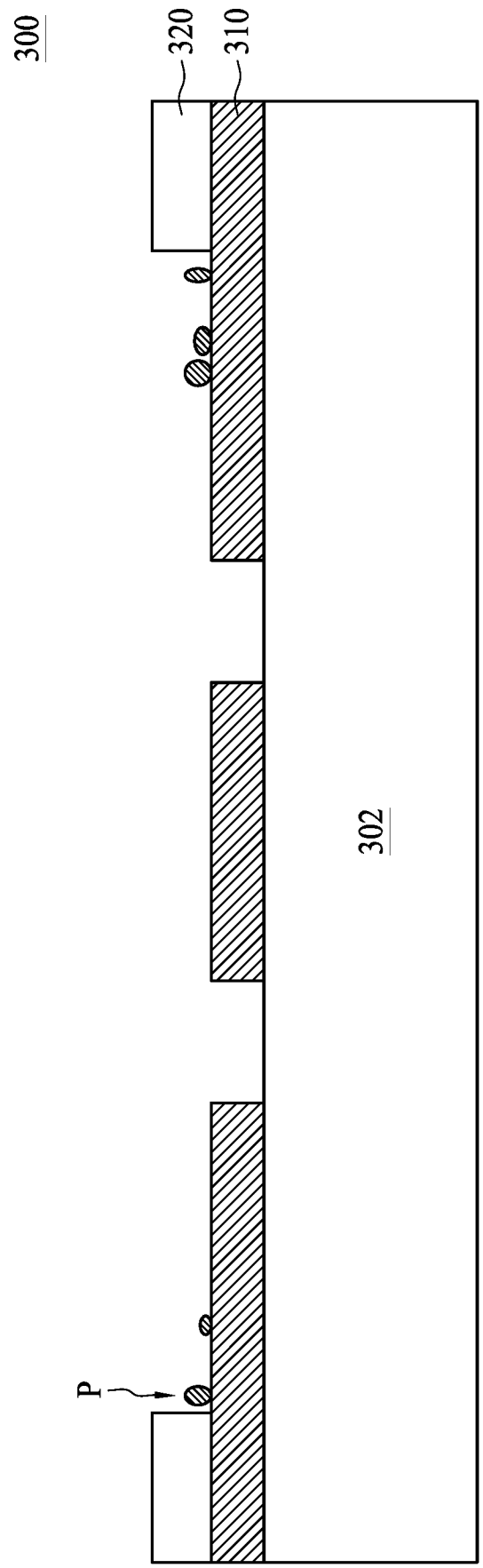
FIGS. 3A to 3D are schematic drawings of the photomask at various stages of fabrication according to aspects of the present disclosure in one or more embodiments.

In some embodiments, the photomask substrate can be a substrate of an EUV photomask 200 as shown in FIG. 2A. In other embodiments, the photomask substrate can be a substrate of an optical photomask substrate such as a phase-shifting photomask 300 as shown in FIG. 3A. Accordingly, the EUV photomask 200 includes a photomask substrate 202, as shown in FIG. 2A, and the phase-shifting photomask 300 includes a photomask substrate 302, as shown in FIG. 3A. The photomask substrates 202 and 302 respectively may be any size suitable for use as a photomask. In some embodiments, the photomask substrates 202 and 302 respectively include a silicon-based material such as quartz (i.e., silicon oxide), fused quartz and the like. In some embodiments, the photomask substrates 202 and 302 respectively include a low thermal expansion material (LTEM). In other embodiments, the photomask substrates 202 and 302 respectively include suitable light-transmitting material.

Referring to FIG. 2A, in sonic embodiments, the EUV photomask 200 includes a multilayered reflective structure 210 disposed over a surface of the photomask substrate 202. In some embodiments, the multilayered reflective structure 210 includes a Ru/Si multilayered reflective structure, a Mo/Be multilayered reflective structure, a Mo compound/Si compound multilayered reflective structure, a Si/Mo/Ru multilayered reflective structure, a Si/Mo/Ru/Mo multilayered reflective structure or a Si/Ru/Mo/Ru multilayered reflective structure. For example, when the multilayered reflective structure 210 includes the Mo compound/Si compound multilayered reflective structure, the Mo layer and the Si layer may be alternately arranged with between about 40 pairs and 50 pairs. Each pair of the Mo layer and the Si layer may include a Mo layer with a thickness of approximately 3 nm and a Si layer with a thickness of approximately 4 nm, but the disclosure is not limited thereto. In some embodiments, the quantity of the Mo/Si pairs, the thickness of the Mo layers, and the thickness of the Si layers are adjusted such that the multilayered reflective structure 210 may have an EUV light reflectivity of about 67% at a wavelength of 13.5 nm, but the disclosure is not limited thereto.

The capping layer 220 of the EUV photomask 200 can include a Ru-containing layer. For example, the capping layer 220 can include a ruthenium oxide layer. In some embodiments, a thickness of the capping layer 220 is between approximately 1 nm and approximately 5 nm. Because the capping layer 220 serves as a buffer between the multilayered reflective structure 210 and a hard mask layer (not shown), the thickness of the capping layer 220 should be less than approximately 5 nm such that the capping layer 220 does not interfere with the EUV exposure.

The absorber 230 is an opaque, light-shielding layer. In one embodiment, the absorber 230 has a thickness not less than about 50 nm to prevent light leakage or poor contrast during the wafer lithography process. In an alternative embodiment, the absorber 230 has a thickness less than about 150 nm in order to avoid the need to perform optical proximity correction (OPC) for forming the mask. In another embodiment, the absorber 230 has a thickness the same as the total thickness of the multilayered reflective structure 210 and the capping layer 220. In another embodiment, the absorber 230 has a thickness the same as the total thickness of the multilayered reflective structure 210, the capping layer 220, and the hard mask layer (not shown). In one embodiment, the absorber 230 includes tantalum-based materials with essentially no oxygen, such as tantalum silicide-based materials (TaSi), nitrogenized tantalum boride-based materials (TaBN), and tantalum nitride-based materials (TaN). In another embodiment, the absorber 230 includes tantalum- and oxygen-based materials, such as oxidized and nitrogenized tantalum and silicon-based materials (TaSiON), tantalum boron oxide-based materials (TaBO), and oxidized and nitrogenized tantalum-based materials (TaON).

Additionally, the EUV photomask 200 may include other layers such as a backside coating layer and/or an anti-reflective coating (ARC), though not shown. Further, other photomask configurations may also be provided as the EUV photomask 200.

Referring to FIG. 3A, in some embodiments, the phase-shifting photomask 300 includes a phase-shifting layer (PSL) 320 formed over a surface of the photomask substrate 302, and a shielding layer 310. The phase-shifting layer 320 is formed to transmit less than about 20% of incident light and produce a phase shift of about 180 degrees with respect to transmitted light (i.e., light transmitted through the light-transparent substrate). In some embodiments, the phase-shifting layer 320 includes molybdenum suicide (MoSi), molybdenum-silicide-nitride (MoSiN), molybdenum silicide oxynitride (MoSiON), titanium nitride, titanium silicon nitride or silicon nitride, but the disclosure is not limited to this. The shielding layer 310 may include chromium (Cr), and may include other layers such as chromium oxide, chromium nitride and chromium oxynitride. Although some examples are provided of materials that may be used for each of the substrate 302, the phase-shifting layer 320 and the shielding layer 310, it should be understood that other suitable materials as known in the art may be equally used without departing from the scope of the present disclosure. Additionally, the phase-shifting photomask 300 may include other layers such as a backside coating layer and/or an anti-reflective coating (ARC), though not shown. Further, other photomask configurations may also be provided as the phase-shifting photomask 300.

In some embodiments, the EUV photomask 200 and the phase-shifting photomask 300 may include a pellicle (not shown), which is used to serve as a protective cover. The pellicle can protect the patterns over the EUV photomask 200 and the phase-shifting photomask 300 from damage and/or contaminant particles. The pellicle can be a thin film on a frame which covers a patterned surface of the RN photomask 200 and the phase-shifting photomask 300.

Referring to FIGS. 2A and 3A, in an exposure operation, different gases may be introduced into the exposure apparatus. For example, Cl, H and N, which are very common in operation, may be introduced. Cl is used to etch a specific material, such as Al, Si, Cr and others, while H and N are used as chamber-cleaning gases or passivation gases to support the main etching gases. In such case, it is inevitable that the residue gases may be mixed, reactions may occur, and thus an unwanted product may be formed. For example, Cl-based gases may produce HCl according to the following chemical equations:

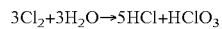

$$3Cl_2 + 3H_2O \rightarrow 5HCl + HClO_3$$

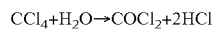

$$CCl_4 + H_2O \rightarrow COCl_2 + 2HCl$$

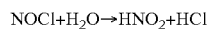

$$NOCl + H_2O \rightarrow HNO_2 + HCl$$

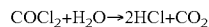

$$COCl_2 + H_2O \rightarrow 2HCl + CO_2$$

N-based gases may produce $HNO_3$ according to the following chemical equations:

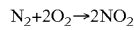

$$N_2 + 2O_2 \rightarrow 2NO_2$$

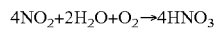

$$4NO_2 + 2H_2O + O_2 \rightarrow 4HNO_3$$

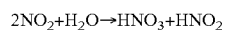

$$2NO_2 + H_2O \rightarrow HNO_3 + HNO_2$$

$$2HNO_2 \rightarrow NO + NO_2 + H_2O$$

In some embodiments, metals, such as noble metals, are able to resist against most acids and alkalis, but react when subjected to nitric acid hydrochloride treatment. When Cl-based gases and N-based gases are mixed, HCl and $HNO_3$ may be formed. Further, nitric acid hydrochloride may be formed in the processing apparatus, and results in nitric acid hydrochloride etching, but the disclosure is not limited to these materials.

In some embodiments, when metals, such as the noble metals, are etched by the nitric acid hydrochloride, the etched metal nanoparticles may fall on the photomasks 200 and 300. Referring to FIGS. 2A and 3A, therefore, the photomask substrate 202 may have a plurality of conductive nanoparticles P disposed over the surface of the photomask substrate 202, and the photomask substrate 302 may have a plurality of conductive nanoparticles P disposed over the surface of the photomask substrate 302. The conductive nanoparticles P may include metal. In some embodiments, the conductive nanoparticles P may include noble metals, such as gold (Au), ruthenium (Ru), rhodium (Rh), palladium (Pd), silver (Ag), osmium (Os), iridium (Ir), or platinum (Pt).

Figure 2B:
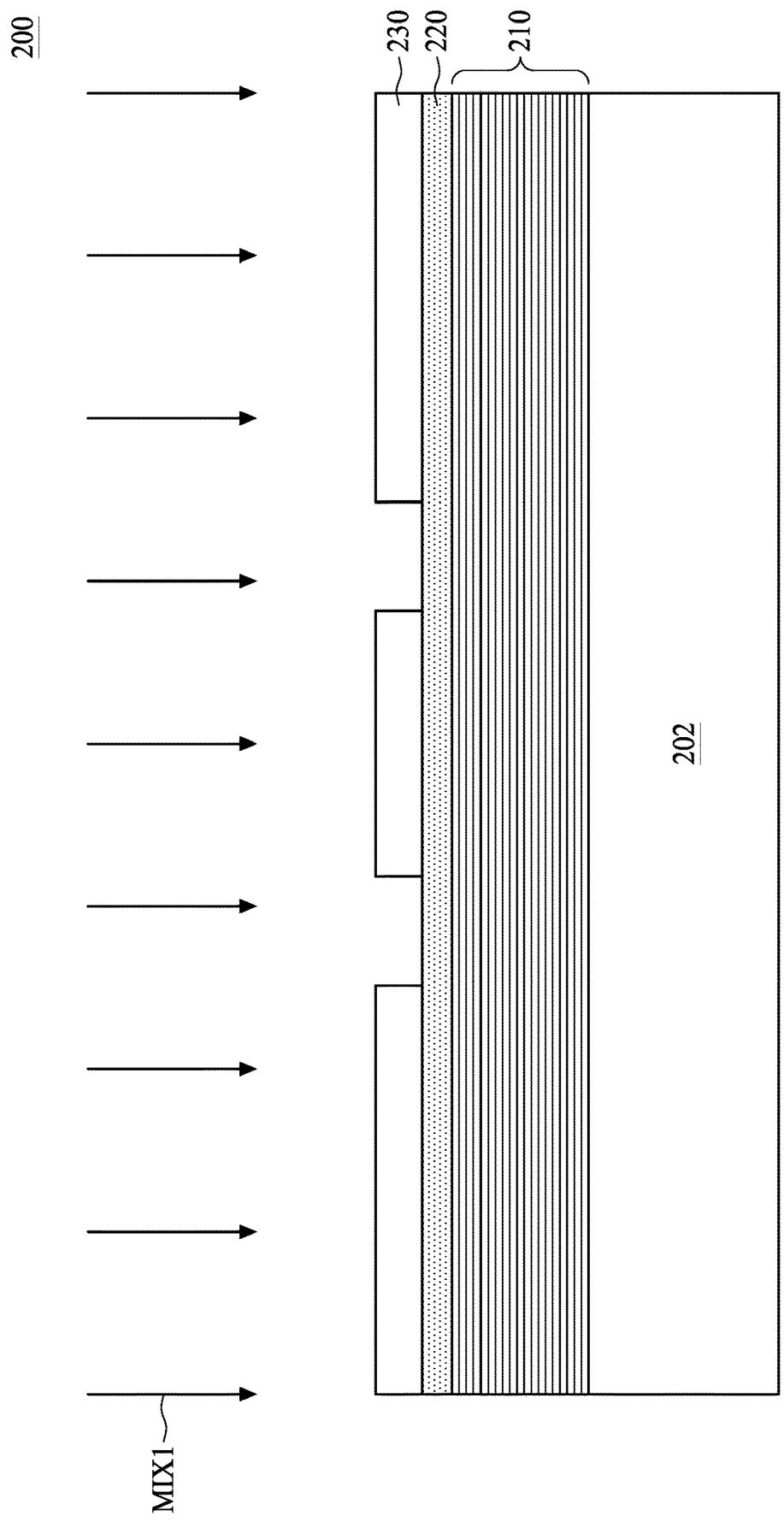
Figure 3B:
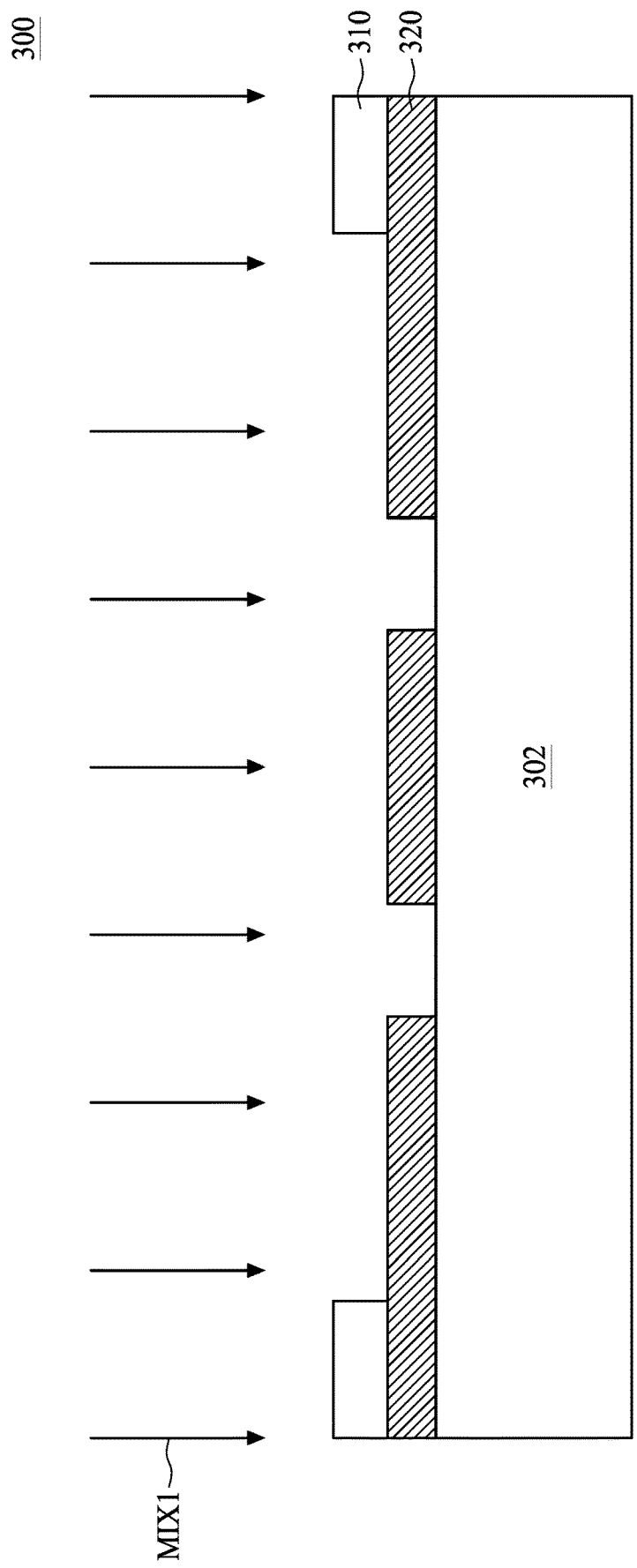

At operation 14, a first mixture MIX1 is applied to the photomask substrate 202 or 302. In some embodiments, the first mixture MIX1 is applied to remove the conductive nanoparticles P, as shown in FIGS. 2B and 3B. The first mixture MIX1 includes an SC1 solution, deionized (DI) water, and ozone ($O_3$). The SC1 solution includes $NH_4OH$, $H_2O_2$ and $H_2O$ in a selected ratio. In some embodiments, a ratio of the DI water to the SC1 solution is 1:1. In some embodiments, a temperature of the first mixture MIX1 is between approximately 20° C. and 40° C. It should be noted that if the temperature of the first mixture MIX1 is less than 20° C., a removal rate of the conductive nanoparticles is reduced, and if the temperature of the first mixture MIX1 is greater than 40° C., the first mixture MIX1 may unwantedly damage other layers such as the capping layer 220 or the shielding layer 310. In some embodiments, a flow rate of the first mixture MIX1 may be between approximately 1000 ml/min and approximately 5000 ml/min. In some embodiments, a duration of the applying of the first mixture MIX1 is between approximately 8 minutes and approximately 15 minutes.

In some embodiments, the applying of the first mixture MIX1 further includes a mega sonic agitation, and a frequency of the mega sonic agitation is between approximately 1 MHz and approximately 10 MHz, but the disclosure is not limited thereto.

In some embodiments, the method 10 further includes performing a spin after the applying of the first mixture MIX1, such that the first mixture MIX1 and the conductive nanoparticles P dissolved in the first mixture MIX1 can be removed from the surface of the photomask substrate 202 or 302.

Figure 2C:
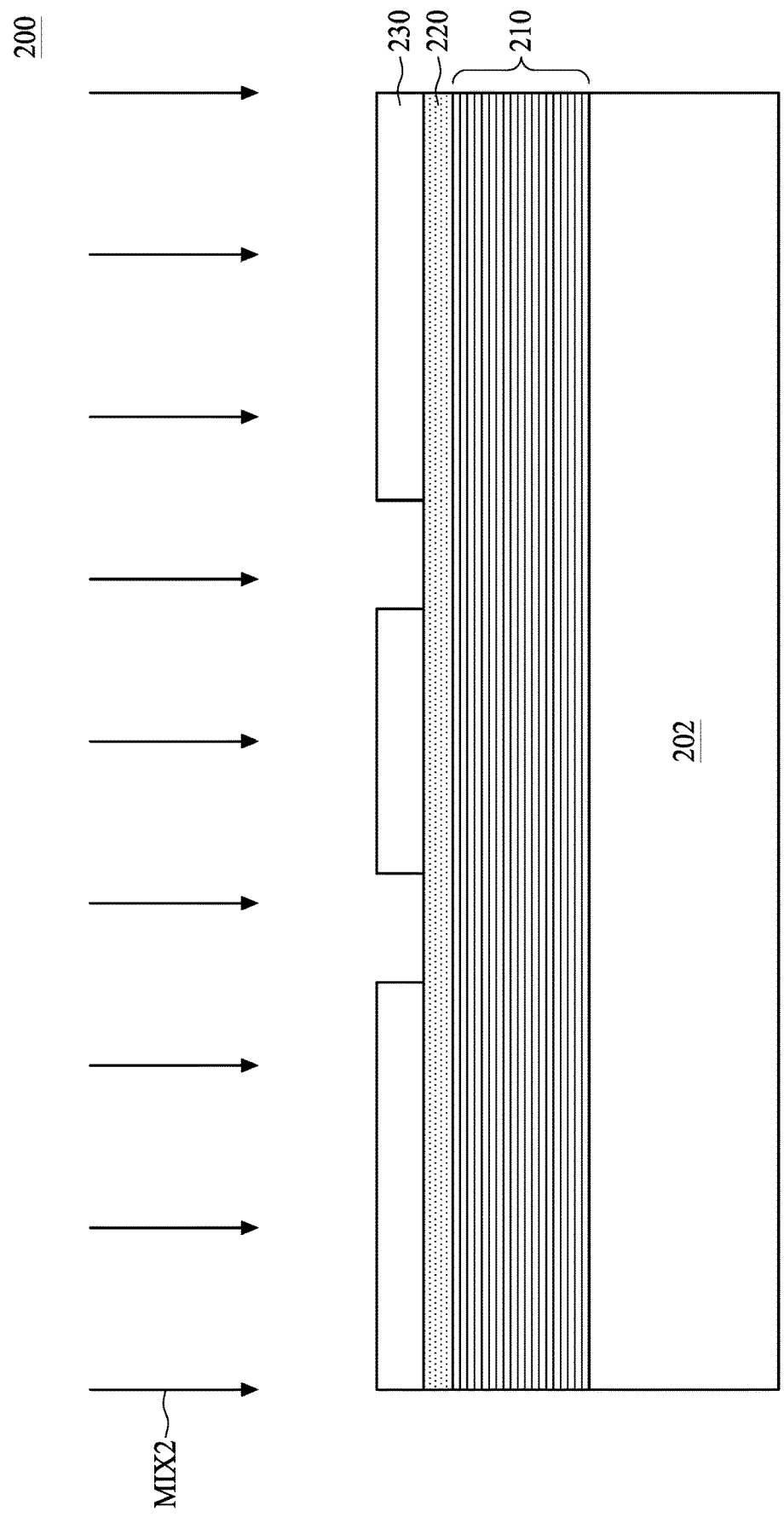
Figure 3C:
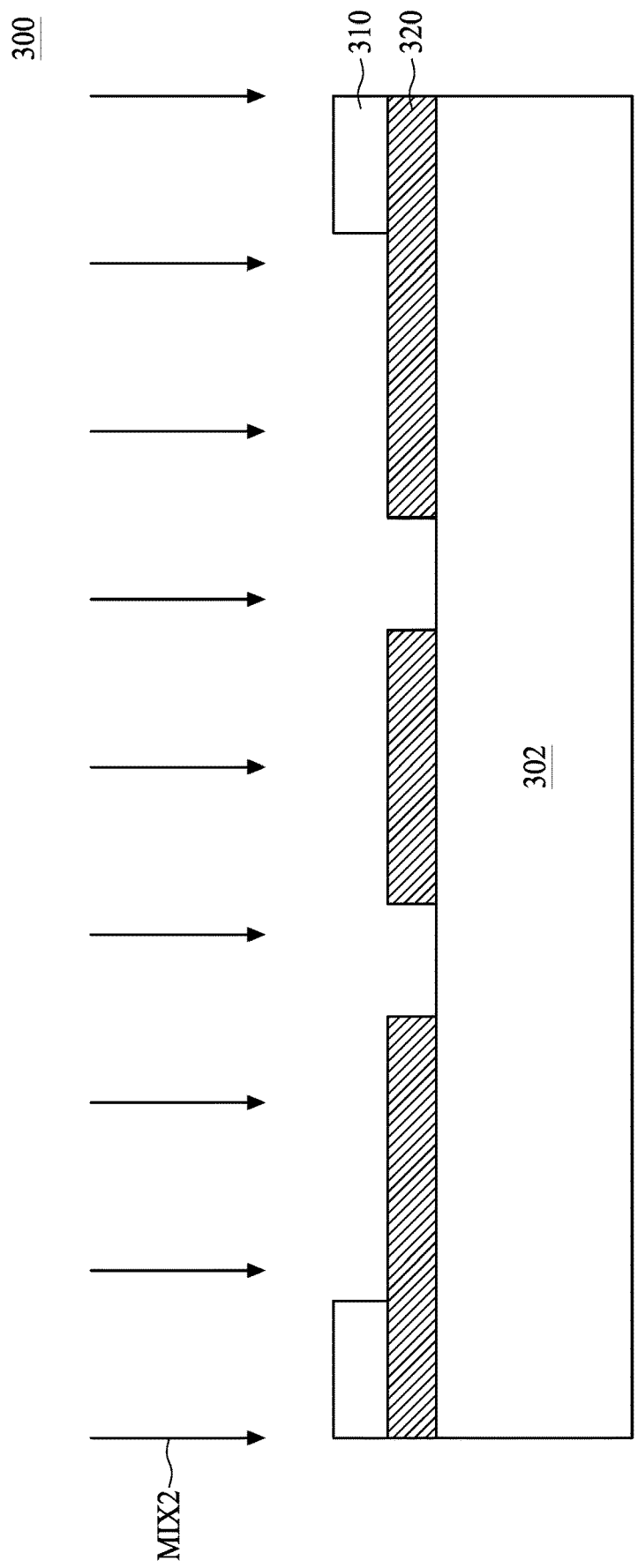

In some embodiments, the method 10 can include an operation 15, which can be performed after the operation 14 or after the performing of the spin. Referring to FIGS. 2C and 3C, at operation 15, a second mixture MIX2 is applied to the photomask substrate 202 or 302. The second mixture MIX2 includes DI water and $H_2$. In some embodiments, a temperature of the second mixture MIX2 is between approximately 20° C. and 40° C. In some embodiments, a flow rate of the second mixture MIX2 may be between approximately 1000 ml/min and approximately 3000 ml/min. In some embodiments, a duration of the applying of the second mixture MIX2 is between approximately 5 minutes and approximately 15 minutes.

In some embodiments, the applying of the second mixture MIX2 further includes a mega sonic agitation, and a frequency of the mega sonic agitation is between approximately 1 MHz to approximately 10 MHz, but the disclosure is not limited thereto.

In some embodiments, the method 10 further includes performing a spin after the applying of the second mixture MIX2, such that the second mixture MIX2 and any residue can be removed from the surface of the photomask substrate 202 or 302.

Figure 2D:
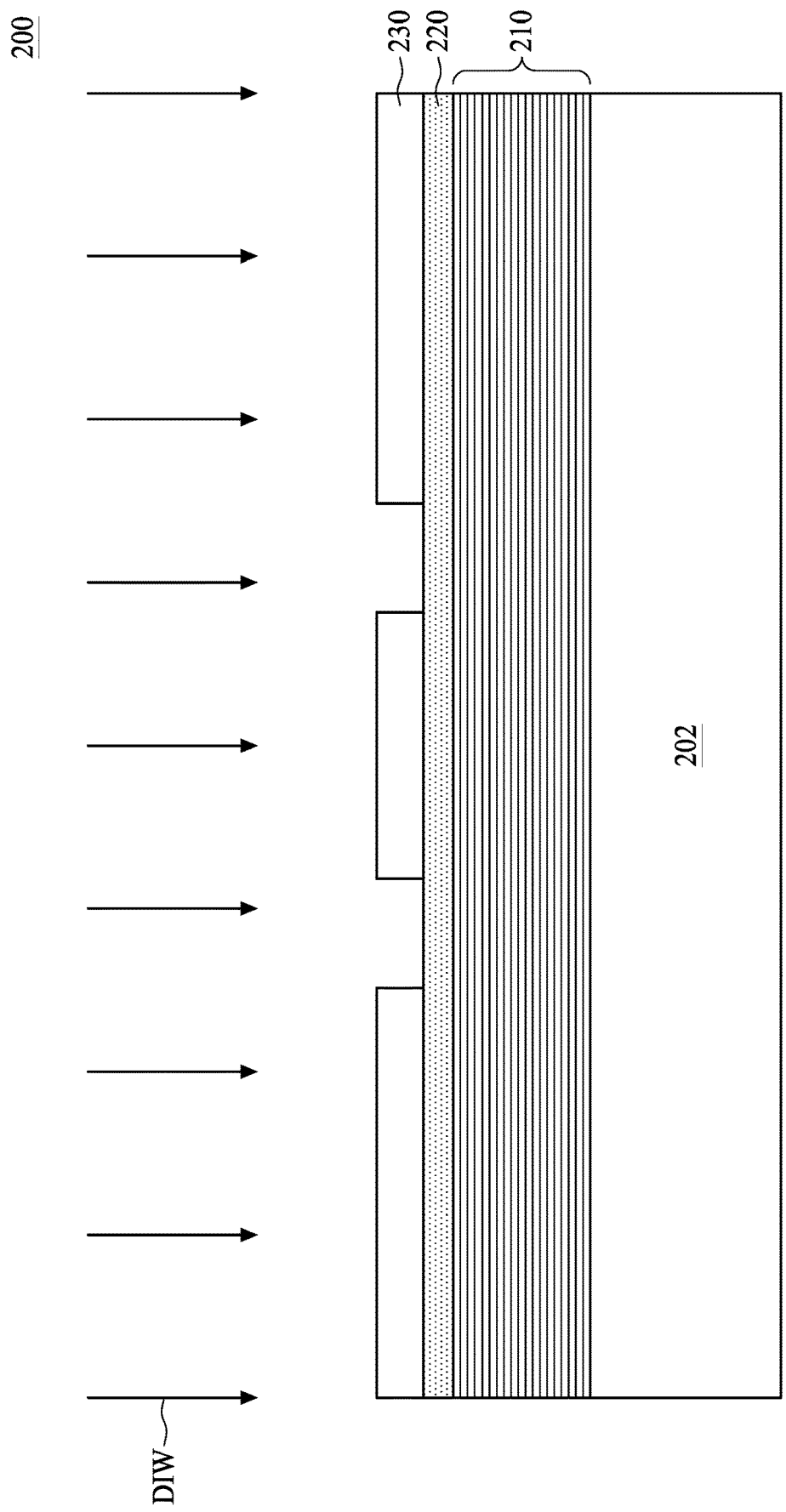
Figure 3D:
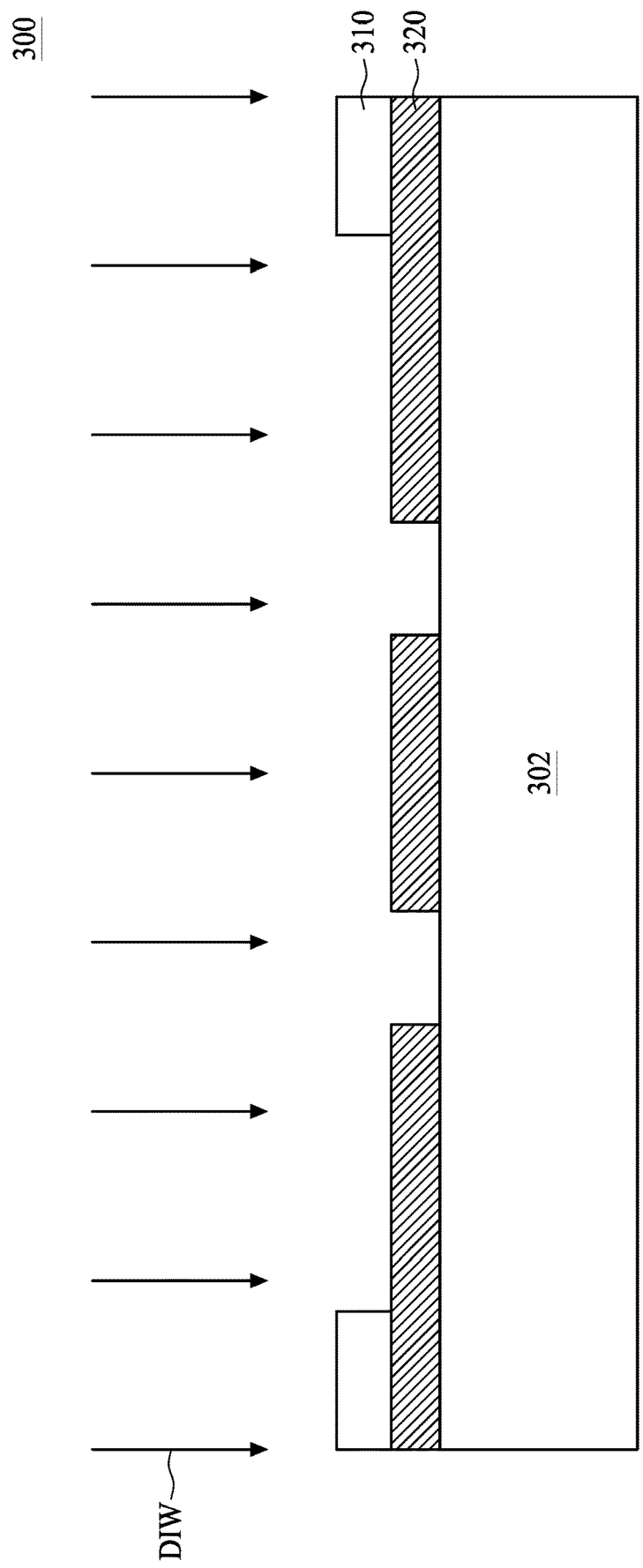

At operation 16, DI water is applied. As shown in FIGS. 2D and 3D, the DI water DIW is applied to the photomask substrate 202 or 302. In some embodiments, a temperature of the DI water DIW is between approximately 20° C. and 40° C. In some embodiments, a flow rate of the DI water DIW may be between approximately 1000 ml/min and approximately 1500 ml/min, in some embodiments, a duration of the applying of the DI water DIN is between approximately 1 minute and approximately 5 minutes.

In some embodiments, the method 10 further includes performing a spin after the applying of the DI water DIW, such that any residue can be removed from the surface of the photomask substrate 202 or 302.

In some embodiments, the conductive nanoparticles P can be removed by the first mixture MIX1, and any residue left can be removed by the DI water rinse. In other embodiments, the conductive nanoparticles P can be removed by the first mixture MIX1, and any residue left can be removed by a second mixture MIX2 and the DI water rinse. In some embodiments a total duration of the performing of the operations 14, 15 and 16 is between approximately 5 minutes and approximately 30 minutes, but the disclosure is not limited thereto. In some embodiments, a removal rate of the conductive nanoparticles is greater than approximately 90%. In some embodiments, the removal rate of the conductive nanoparticles is greater than approximately 94% when the total duration of the performing of the operations 14, 15 and 16 is approximately 8 minutes. In some embodiments, the removal rate of the conductive nanoparticles is approximately 100% when the total duration of the performing of the operations 14, 15 and 16 is approximately 10 minutes.

In some comparative approaches, an SPM solution including $H_2SO_4$, $H_2O_2$ and $H_2O$ may be used to remove the conductive nanoparticles. In some comparative approaches, a mixture including the SPM solution and DI water may be used to remove the conductive nanoparticles. In some comparative approaches, an SC1 solution may be used to remove the conductive nanoparticles. In some comparative approaches, an ozonated deionized water ($DIO_3$) may be used to remove the conductive nanoparticles. In some comparative approaches, $O_3$ with $H_2O$ and UV illumination may be used to remove the conductive nanoparticles. It is found that the abovementioned comparative approaches may be performed for a duration in a range of 5 minutes to 40 minutes, which is greater than the duration of the performing of the operations 14, 15 and 16 of the method. The removal rate of the conductive nanoparticles is approximately 0% in such comparative approaches.

According to the method for cleaning the substrate 10, the conductive nanoparticles are removed from a surface having conductive material such as the phase-shifting layer and the capping layer. The removal rate of the conductive nanoparticles is greater than approximately 90% using a duration less than that of the comparative approaches. Further, it is found that a thickness and surface integrity of the capping layer and the phase-shifting layer are not diminished by the method for cleaning the photomask.

In some embodiments, the method for cleaning the substrate 10 can be used in semiconductor substrate manufacturing operations. FIGS. 4A to 4D are schematic drawings of a semiconductor structure at various stages according to aspects of the present disclosure in one or more embodiments.

At operation 12, a semiconductor substrate is received.

Figure 4A:
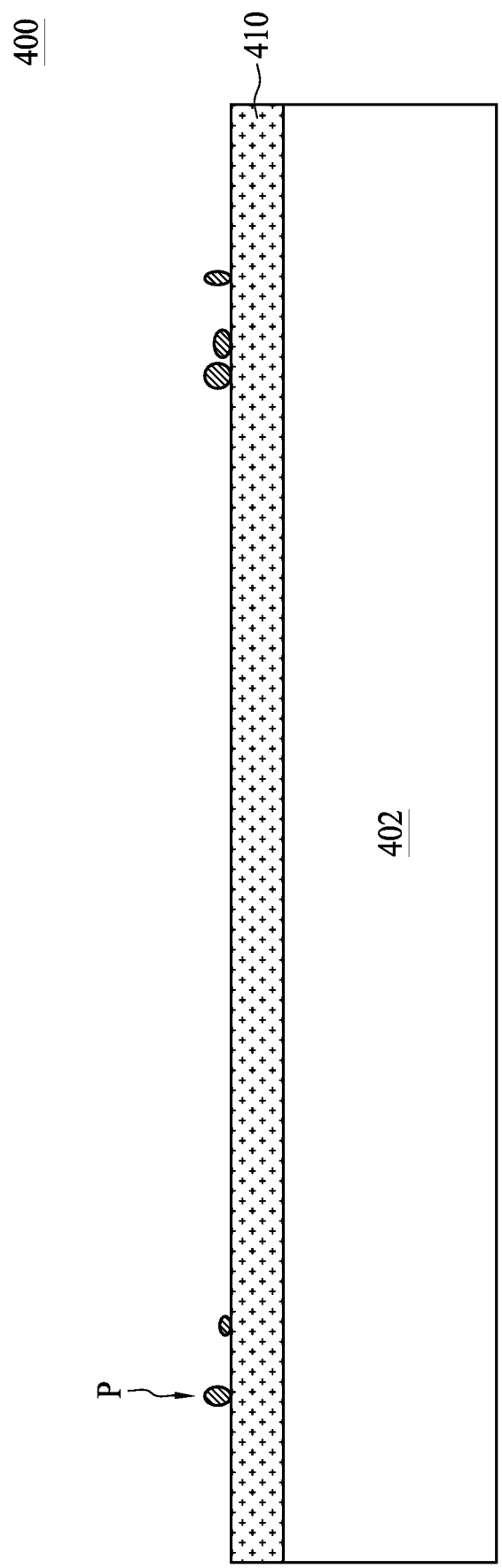
FIGS. 4A to 4D are schematic drawings illustrating a semiconductor structure at various stages of fabrication according to aspects of the present disclosure in one or more embodiments.

As shown in FIG. 4A, in some embodiments, a semiconductor substrate 402 is received. In some embodiments, the semiconductor substrate 402 can have a conductive layer disposed thereon. In some embodiments, the semiconductor substrate 402 can have a semiconductor layer disposed thereon. In such embodiments, the method for cleaning the substrate 10 can be performed to remove nanoparticles from the semiconductor substrate 402. In such embodiments, a total duration of the performing of operations 14, 15 and 16 can be between approximately 5 minutes and approximately 30 minutes, but the disclosure is not limited thereto.

In some embodiments, the semiconductor substrate 402 can have an insulating layer 410 disposed thereon, as shown in FIG. 4A. In some embodiments, the semiconductor substrate 402 can include a bulk material under the insulating layer 410. In other embodiments, the semiconductor substrate 402 can include conductive and/or semiconductive features formed therein and covered by the insulating layer 410. In such embodiments, the conductive and/or semiconductive features may form devices used to construct an integrated circuit, but the disclosure is not limited thereto. The insulating layer 410 can include silicon oxide, silicon nitride, silicon oxynitride, silicon carbide, low-k materials, or the like.

In some embodiments, conductive nanoparticles P may be formed during manufacturing operations and may fall onto the semiconductor substrate 402, as shown in FIG. 4A. The formation of the conductive nanoparticles P is similar to that of the conductive nanoparticles described above, and therefore repeated description is omitted in the interest of brevity.

Figure 4B:
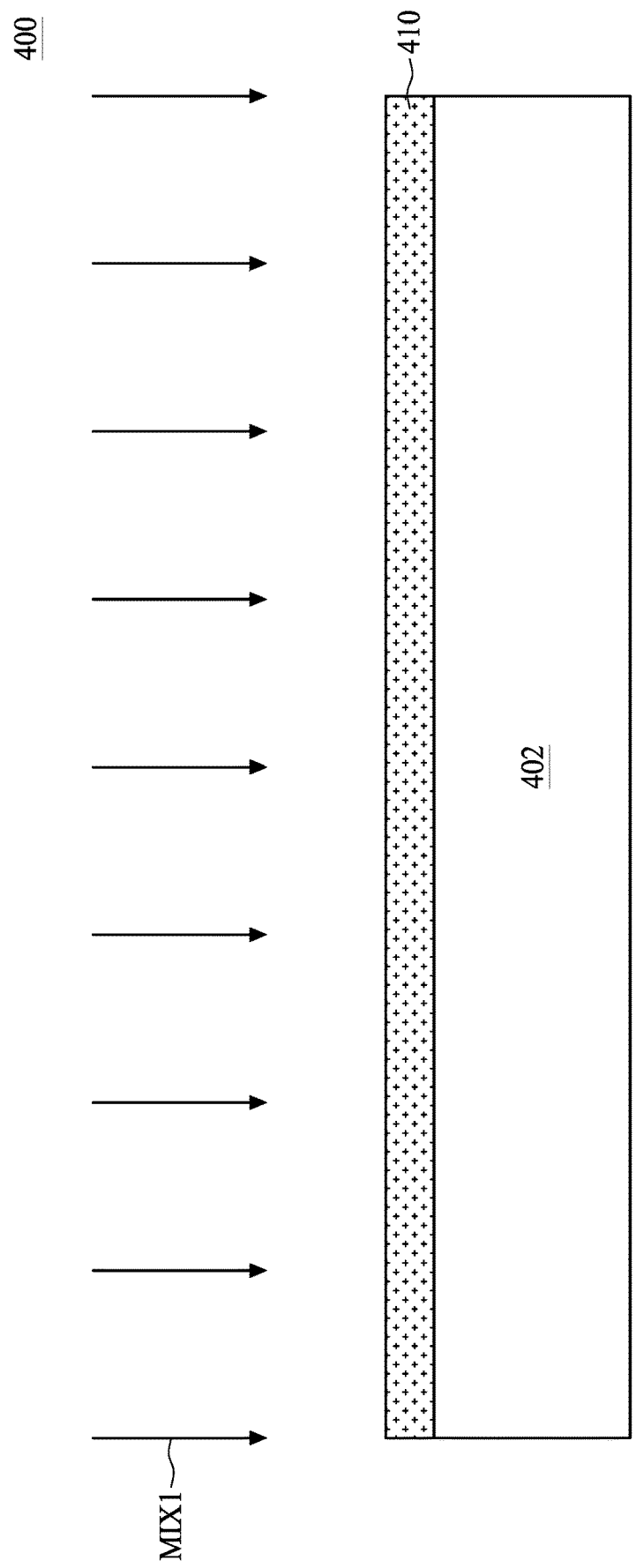

At operation 14, a first mixture MIX1 is applied to the semiconductor substrate 402. In some embodiments, the first mixture MIX1 is applied to remove the conductive nanoparticles P, as shown in FIG. 4B. The first mixture MIX 1 includes an SC1 solution, DI water and $O_3$. The SC1 solution includes $NH_4OH$, $H_2O_2$ and $H_2O$ in a selected ratio. In some embodiments, a ratio of the DI water to the SC1 solution is 1:1. In some embodiments, a temperature of the first mixture MIX1 is between approximately 20° C. and 40° C. It should be noted that if the temperature of the first mixture MIX1 is less than 20° C., a removal rate of the conductive nanoparticles is reduced, and if the temperature of the first mixture MIX1 is greater than 40° C., the first mixture MIX1 may damage the underlying layer. In some embodiments, a flow rate of the first mixture MIX1 may be between approximately 1000 ml/min and approximately 5000 ml/min. In some embodiments, a duration of the applying of the first mixture MIX1 can be less than 10 minutes. In some embodiments, the period of the applying of the first mixture MIX1 is between approximately 6 minutes and approximately 10 minutes.

In some embodiments, the applying of the first mixture MIX1 further includes a mega sonic agitation, and a frequency of the mega sonic agitation is between approximately 1 MHz and approximately 10 MHz, but the disclosure is not limited thereto.

In some embodiments, the method 10 further includes performing a spin after the applying of the first mixture MIX1, such that the first mixture MIX1 and the conductive nanoparticles P dissolved in the first mixture MIX1 can be removed from the surface of the semiconductor substrate 402.

At operation 15, which can be performed after the operation 14 or after the performing of the spin, a second mixture MIX2 is applied to the semiconductor substrate 402. The second mixture MIX2 includes DI water and $H_2$. In some embodiments, a temperature of the second mixture MIX2 is between approximately 20° C. and 40° C. In some embodiments, a flow rate of the second mixture MIX2 may be between approximately 1000 ml/min and approximately 3000 ml/min. In some embodiments, a duration of the applying of the second mixture MIX2 is between approximately 5 minutes and approximately 15 minutes.

In some embodiments, the applying of the second mixture MIX2 further includes a mega sonic agitation, and a frequency of the mega sonic agitation is between approximately 1 MHz and 10 approximately MHz, but the disclosure is not limited thereto.

Figure 4C:
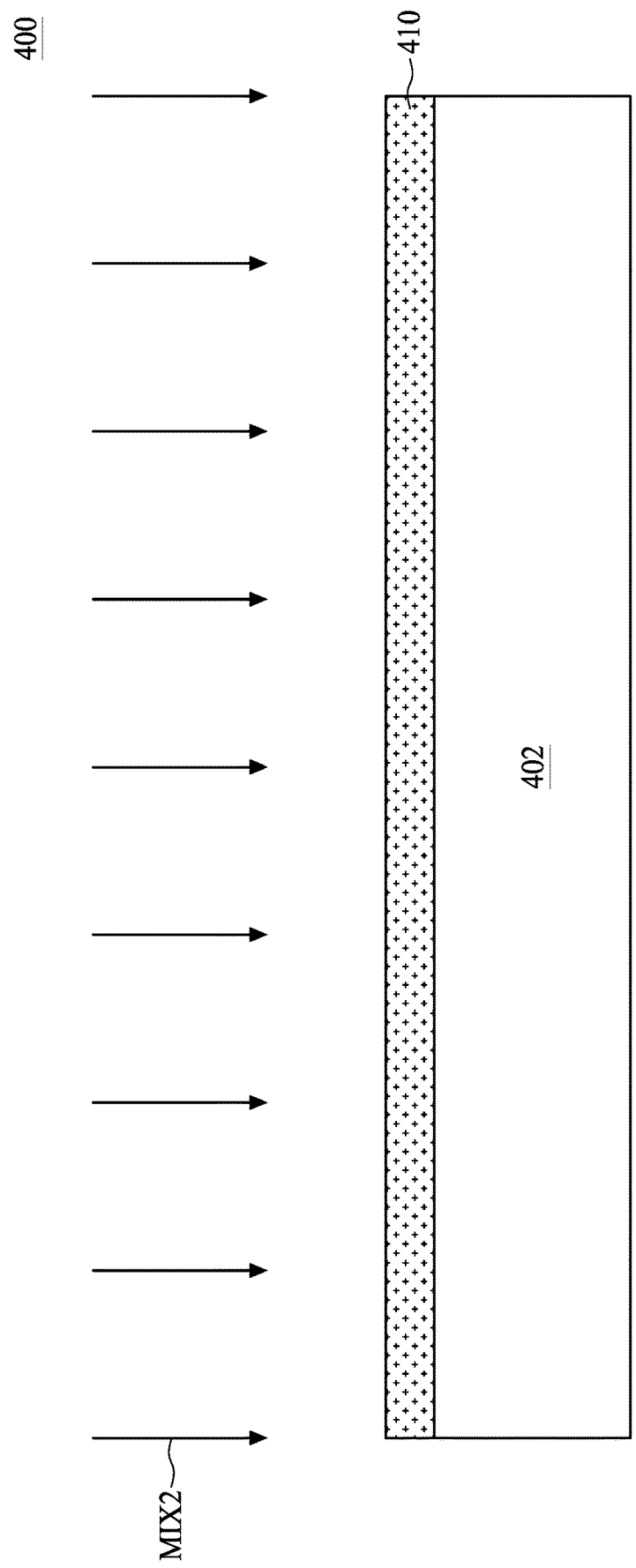

In some embodiments, the method 10 further includes performing a spin after the applying of the second mixture MIX2, such that the second mixture MIX2 and any residue can be removed from the surface of the semiconductor substrate 402, as shown in FIG. 4C.

Figure 4D:
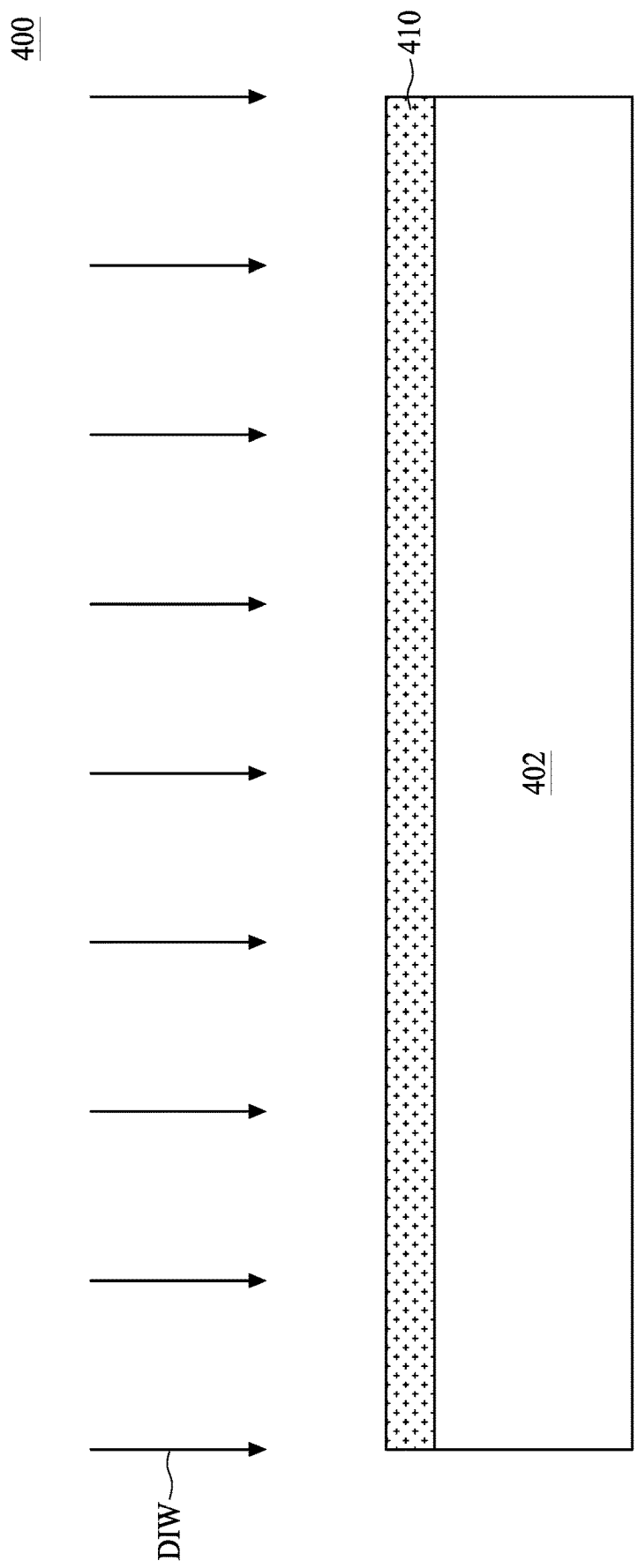

At operation 16, DI water is applied. As shown in FIG. 4D, the DI water DIW is applied to the semiconductor substrate 402. In some embodiments, a temperature of the DI water DRY is between approximately 20° C. and 40° C. In some embodiments, a flow rate of the DI water DIW may be between approximately 1000 ml/min. and approximately 1500 ml/min. In some embodiments, a duration of the applying of the DI water DIW is between approximately 1 minute and approximately 5 minutes.

In some embodiments, the method 10 further includes performing a spin after the applying of the DI water DIW, such that any residue can be removed from the surface of the semiconductor substrate 402.

In some embodiments, the conductive nanoparticles P can be removed by the first mixture MIX1, and any residue left can be removed by the DI water rinse. In other embodiments, the conductive nanoparticles P can be removed by the first mixture MIX1, and any residue left can be removed by the second mixture MIX2 and the DI water rinse. In some embodiments, the duration of the operation 14 can be reduced to less than approximately 10 minutes because the conductive nanoparticles P are removed from an insulating surface. In some embodiments, the removal rate of the conductive nanoparticles is greater than approximately 99% when the duration of the operation 14 is approximately 6 minutes. In some embodiments, the removal rate of the conductive nanoparticles is approximately 100% when the duration of the operation 14 is approximately 10 minutes.

In comparative approaches, which may use an SPM solution including $H_2SO_4$, $H_2O_2$ and $H_2O$, a mixture including the SPM solution and DI water, an SC1 solution, $DIO_3$, or $O_3$ with $H_2O$ and UV illumination as a cleaning solution for a duration of 5 minutes to 40 minutes, it is found that the removal rate of the conductive nanoparticles is approximately 0%.

According to the method for cleaning the substrate 10, the conductive nanoparticles are removed from an insulating surface. The removal rate of the conductive nanoparticles is greater than approximately 90% when the method is applied for a duration less than those of comparative approaches. Further, it is found that a thickness and surface integrity of the insulating layer are not diminished by the method for cleaning the substrate 10.

Accordingly, the present disclosure provides a method for removing contamination or nanoparticles from a substrate. In some embodiments, the method for removing the nanoparticles provides a cleaning operation for removing nanoparticles from the photomask substrate or a semiconductor substrate. In some embodiments, the method for removing contamination provides a cleaning operation for removing conductive nanoparticles from the photomask substrate or a semiconductor substrate. The removal rate of the conductive nanoparticles can be improved to greater than approximately 90% by the cleaning operation while a thin layer over the photomask substrate or a semiconductor substrate can be kept intact during the cleaning operation. As mentioned above, when the substrate has a conductive material layer formed thereon, the conductive nanoparticle removal rate can be improved to greater than approximately 90%, while the thickness and the surface integrity of the conductive material layer are not diminished, in contrast to comparative approaches, which provide conductive nanoparticle removal rate of about 0%. As mentioned above, when the substrate has an insulating material layer formed thereon, the conductive nanoparticle removal rate can be improved to greater than approximately 90%, even when applied for in duration less than that applied to the conductive material layer.

According to sonic embodiments of the present disclosure, a method for cleaning a substrate is provided. The method includes following operations. A photomask substrate with a multilayered reflective structure is received. The multilayered reflective structure is disposed over a surface of the photomask substrate. A capping layer is disposed on the multilayered reflective structure, and an absorber is disposed on the capping layer. The photomask substrate has a plurality of conductive nanoparticles disposed over the surface of the photomask substrate. A first mixture is applied to remove the conductive nanoparticles. The first mixture includes an SC1 solution, DI water and $O_3$. A second mixture is applied to the photomask substrate. The second mixture includes DI wafer and $H_2$. A temperature of the second mixture is between approximately 20° C. and 40° C. The applying of the second mixture further includes a mega sonic agitation, and a frequency of the mega sonic agitation is greater than 3 MHz. A flow rate of the first mixture is between approximately 1000 ml/min and approximately 5000 ml/min. A flow rate of the second mixture is between 1000 ml/min and approximately 3000 ml/min.

According to some embodiments of the present disclosure, another method for cleaning a substrate is provided. The method includes following operations. A photomask substrate is received. A phase-shifting layer is disposed on a surface of the photomask substrate, and a shielding layer is disposed on the phase-shifting layer. The photomask substrate has a plurality of conductive nanoparticles disposed over the surface of the photomask substrate. A first mixture is applied to remove the conductive nanoparticles. The first mixture includes an SC1 solution. DI water and $O_3$. A second mixture is applied to the photomask substrate. The second mixture includes DI wafer and $O_3$. A temperature of the second mixture is between approximately 20° C. and 40° C. The applying of the second mixture further includes a mega sonic agitation, and a frequency of the mega sonic agitation is greater than 3 MHz. A flow rate of the first mixture is between approximately 1000 ml/min and approximately 5000 ml/min. A flow rate of the second mixture is between 1000 ml/min and approximately 3000 ml/min.

According to some embodiments of the present disclosure, another method for cleaning a substrate is provided. The method includes following operations. A semiconductor substrate is received. A plurality of patterns are disposed on a surface of the semiconductor substrate. The semiconductor substrate has a plurality of conductive nanoparticles disposed over the surface of the semiconductor substrate. A first mixture is applied to remove the conductive nanoparticles. The first mixture includes an SC1 solution, DI water and $O_3$. A second mixture is applied to the semiconductor substrate. The second mixture includes DI wafer and $H_2$. A temperature of the second mixture is between approximately 20° C. and 40° C. The applying of the second mixture further includes a mega sonic agitation, and a frequency of the mega sonic agitation is greater than 3 MHz. A flow rate of the first mixture is between approximately 1000 ml/min and approximately 5000 ml/min. A flow rate of the second mixture is between 1000 ml/min and approximately 3000 ml/min.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for cleaning a substrate, comprising:
receiving a photomask substrate with a multilayered reflective structure disposed over a surface of the photomask substrate, a capping layer disposed on the multilayered reflective structure, and an absorber disposed over the capping layer, wherein the photomask substrate has a plurality of conductive nanoparticles disposed over the surface of the photomask substrate;
applying a first mixture comprising an SC1 solution, deionized (DI) water, and ozone ($O_3$) to the photomask substrate to remove the conductive nanoparticles; and
applying a second mixture to the photomask substrate, wherein the second mixture comprises DI water and $H_2$, and a temperature of the second mixture is between approximately 20° C. and 40° C.,
wherein the applying of the second mixture further comprises a mega sonic agitation, and a frequency of the mega sonic agitation is greater than 3 MHz,
wherein a flow rate of the first mixture is between approximately 1000 ml/min and approximately 5000 ml/min, and a flow rate of the second mixture is between approximately 1000 ml/min and approximately 3000 ml/min.

2. The method of claim 1, wherein the multilayered reflective structure comprises a Ru/Si multilayered reflective structure, a Mo/Be multilayered reflective structure, a Mo compound/Si compound multilayered reflective structure, a Si/Mo/Ru multilayered reflective structure, a Si/Mo/Ru/Mo multilayered reflective structure or a Si/Ru/Mo/Ru multilayered reflective structure.

3. The method of claim 1, wherein the capping layer comprises a Ru-containing layer.

4. The method of claim 1, wherein the conductive nanoparticles comprise noble metals.

5. The method of claim 1, further comprising applying a DI water to rinse the photomask substrate.

6. The method of claim 5, further comprising a spin after the applying of the DI water.

7. The method of claim 1, wherein a temperature of the first mixture is between approximately 20° C. and 40° C.

8. The method of claim 1, further comprising performing a spin after the applying of the first mixture.

9. The method of claim 1, wherein a duration of the applying of the first mixture is between approximately 8 minutes and approximately 15 minutes.

10. The method of claim 1, wherein a duration of the applying of the second mixture is between approximately 5 minutes and approximately 15 minutes.

11. The method of claim 1, wherein the conductive nanoparticles are in a scale of approximately 1 nanometer to approximately 100 nanometers in size.

12. A method for cleaning a substrate, comprising:
receiving a photomask substrate with a phase-shifting layer disposed over a surface of the photomask substrate and a shielding layer disposed on the phase-shifting layer, wherein the photomask substrate has a plurality of conductive nanoparticles disposed over the surface of the photomask substrate;
applying a first mixture comprising an SC1 solution, deionized (DI) water, and ozone ($O_3$) to the substrate to remove the conductive nanoparticles; and
applying a second mixture to the photomask substrate, wherein the second mixture comprises DI water and $H_2$, and a temperature of the second mixture is between approximately 20° C. and 40° C.,
wherein the applying of the second mixture further comprises a mega sonic agitation, and a frequency of the mega sonic agitation is greater than 3 MHz,
wherein a flow rate of the first mixture is between approximately 1000 ml/min and approximately 5000 ml/min, a flow rate of the second mixture is between approximately 1000 ml/min and approximately 3000 ml/min.

13. The method of claim 12, wherein the phase-shifting layer comprises molybdenum silicide (MoSi), molybdenum-silicide-nitride (MoSiN), molybdenum silicide oxynitride (MoSiON), titanium nitride, titanium silicon nitride or silicon nitride.

14. The method of claim 12, wherein the shielding layer comprises chromium (Cr), chromium oxide, chromium nitride and chromium oxynitride.

15. The method of claim 12, wherein the conductive nanoparticles comprise noble metals.

16. The method of claim 12, wherein a temperature of the first mixture is between approximately 20° C. and 40° C.

17. A method for cleaning a substrate, comprising:
  receiving a semiconductor substrate having a surface and a plurality of patterns disposed on the surface, wherein the semiconductor substrate has a plurality of conductive nanoparticles disposed over the surface of the semiconductor substrate;
  applying a first mixture comprising an SC1 solution, deionized (DI) water, and ozone ($O_3$) to the semiconductor substrate to remove the conductive nanoparticles; and
  applying a second mixture to the semiconductor substrate, wherein the second mixture comprises DI water and $H_2$, and a temperature of the second mixture is between approximately 20° C. and 40° C.,
  wherein the applying of the second mixture further comprises a mega sonic agitation, and a frequency of the mega sonic agitation is greater than 3 MHz,
  wherein a flow rate of the first mixture is between approximately 1000 ml/min and approximately 5000 ml/min, a flow rate of the second mixture is between approximately 1000 ml/min and approximately 3000 ml/min.

18. The method of claim 17, wherein the patterns comprise insulative materials.

19. The method of claim 18, wherein a duration of the applying of the first mixture is less than approximately 10 minutes.

20. The method of claim 17, further comprising applying a DI water to rinse the semiconductor substrate.

* * * * *